(12) United States Patent
Nezuka

(10) Patent No.: US 9,071,259 B2
(45) Date of Patent: Jun. 30, 2015

(54) A/D CONVERSION SYSTEM

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/471,418

(22) Filed: Aug. 28, 2014

(65) Prior Publication Data

US 2015/0084798 A1 Mar. 26, 2015

(30) Foreign Application Priority Data

Sep. 20, 2013 (JP) ................................. 2013-195433

(51) Int. Cl.
*H03M 3/00* (2006.01)
*H03M 1/00* (2006.01)

(52) U.S. Cl.
CPC .............. *H03M 1/001* (2013.01); *H03M 3/454* (2013.01); *H03M 3/384* (2013.01); *H03M 3/496* (2013.01); *H03M 3/43* (2013.01)

(58) Field of Classification Search
CPC ....... H03M 3/43; H03M 3/406; H03M 3/452; H03M 3/398; H03M 3/464; H03M 3/454; H03M 3/384; H03M 3/496; H03M 7/3026; H03M 7/3033
USPC .................................................. 341/143–155
See application file for complete search history.

(56) References Cited

U.S. PATENT DOCUMENTS

| | | | |
|---|---|---|---|
| 5,101,206 A | 3/1992 | Riedel | |
| 5,844,514 A | 12/1998 | Ringh et al. | |
| 5,936,562 A | 8/1999 | Brooks et al. | |
| 6,300,892 B2 * | 10/2001 | Braun | 341/143 |
| 7,289,054 B1 | 10/2007 | Watanabe | |
| 7,362,252 B1 * | 4/2008 | Pai | 341/143 |
| 7,916,061 B2 | 3/2011 | Chae et al. | |
| 8,552,895 B2 * | 10/2013 | Nezuka | 341/143 |

OTHER PUBLICATIONS

T.C. Leslie and B. Singh 1990. "An Improved Sigma-Delta Modulator Architecture" CH2868-8/90/0000-0372S1.00 © 1990 IEEE, Plessy Research Caswell Ltd.

(Continued)

*Primary Examiner* — Lam T Mai
(74) *Attorney, Agent, or Firm* — Posz Law Group, PLC

(57) ABSTRACT

An input signal is quantized by a quantizer after being passed through plural loop filters. A last-stage loop filter is formed of an operational amplifier for generating an output signal, a sampling capacitor for sampling the input signal, an integrating capacitor for integrating the signal sampled by the capacitor and plural switches for switching over signal paths. A control circuit controls on/off states of the switches to discharge the sampling capacitor and the integrating capacitor and causes the loop filter to repeat a sampling operation and an integrating operation plural times. The control circuit lastly connects the sampling capacitor and the integrating capacitor to a state, which is opposite to the state of the integrating operation time and turns on a converting switch so that the A/D converter A/D-converts the output signal of the loop filter.

3 Claims, 4 Drawing Sheets

(56) References Cited

OTHER PUBLICATIONS

Wei Qin, Bo Hu and Xieting Ling 1999. "Sigma-Delta ADS with Reduced Sample Rate Multibit Quantizer" IEEE Transactions on Circuits and Systems-II: Analog and Digital Signal Processing, vol. 46, No. 6, Jun. 1999.

José M. de la Rosa, "Sigma-Delta Modulators: Tutorial Overview, Design Guide, and State-of-the-Art Survey" IEEE Transactions on Circuits and Systems-I: Regular Papers, vol. 58, No. 1, Jan. 2011.

* cited by examiner

A/D CONVERSION SYSTEM

CROSS REFERENCE TO RELATED APPLICATION

This application is based on and incorporates herein by reference Japanese patent application No. 2013-495433 filed on Sep. 20, 2013.

FIELD

The present disclosure relates to an A/D conversion system, which is configured in a cascade type by using a delta-sigma ($\Delta\Sigma$) modulator.

BACKGROUND

In an A/D conversion system configured by using a delta-sigma modulator, an input signal, which is a voltage signal, is filtered by a loop filter and an output of the loop filter is quantized by a quantizer. In a case that a capacitance value of a capacitor used in the loop filter has an error (variation), a gain of the loop filter including the capacitor becomes erroneous and hence an A/D conversion result becomes erroneous. In a case that an input signal is A/D converted by an A/D conversion system of a single loop type, which has no cascade configuration, the above-described error is negligible. However, it needs many operation cycles and a longer period to output the A/D conversion result.

When input signals outputted from plural sensors are A/D converted sequentially by switching over the input signals, the input signals need be switched over by dividing A/D conversion periods for each input signal. For this reason, that is, for switching over the input signals at high speeds, an A/D conversion system of the cascade type is used. In comparison to the A/D conversion system of the single loop type, which has no cascade configuration, the A/D conversion system of the cascade type has a problem that influence of the A/D conversion error becomes relatively large.

For example, JP 4862943 (patent document) discloses a delta-sigma A/D conversion system of a hybrid incremental type, which is one example of the cascade type. This A/D conversion system cancels the conversion error at the end of a predetermined A/D conversion period.

However, the configuration of the patent document has the following problem. According to the patent document, first-order delta-sigma modulation is performed by sampling an input signal Vin by charging a capacitor with the input signal and connecting repetitively conversion signals, which are used as reference signals in a D/A converting operation, to the capacitor, in accordance with an output signal of a quantizer, which performs a quantizing operation. The output of the quantizer is integrated to generate higher bits (more significant bits) of an A/D conversion result. The A/D conversion system, which uses the first-order delta-sigma modulation, is susceptible to error caused by limitation of a gain of an operational amplifier. An amplifier is required to have a high gain to be less susceptible to the influence of error. Such an amplifier consumes more power and needs a large circuit area. In addition, for improving the resolution in the A/D conversion of a first-order delta-sigma modulator, more operation cycles are required relative to a higher-order delta-sigma modulator. It is thus difficult to increase the number of conversion bits.

In the patent document, the delta-sigma A/D conversion system is configured as the hybrid incremental type. That is, an output of an integrator is A/D converted after a delta-sigma conversion to generate lower bits of an A/D conversion result, and the lower bits thus generated are added to the higher bits generated by the delta-sigma modulation. According to the hybrid incremental type delta-sigma A/D converter, which is one example of the cascade type, the error in the output of the integrator used for the delta-sigma modulation influences the accuracy of A/D conversion. Therefore, an operation for cancelling the error of the integrator is performed so that the accuracy of A/D conversion is improved. However, this error cancellation needs additional operation cycles and increases the period required for A/D conversion.

According to the patent document, the conversion signals are supplied to all of sampling capacitors, to which the input signal is inputted. As a result, a full scale of the A/D conversion (a range of the input signal that the A/D converter can convert the input signal) and a range of the conversion signals become equal. Generally, the range of the input signal hardly exceeds a range of a power supply voltage (voltage between power source and ground). For example, in a case that an amplifier circuit is provided at a pre-stage, the range of the input signal is limited by the output signal range of the amplifier circuit (normally between ½ and ¾ of the power supply voltage).

In a case that the range of the input signal is narrower than the range of the power supply voltage, the ranges of the conversion signals are set to be narrower than the range of the power supply voltage so that the full scale of the A/D conversion is matched to the range of the input signal. In a case that the conversion signals is set to the power supply voltage, only a part of the full scale of the A/D conversion is used for the input signal. In a case that the conversion signals are set to be in narrow ranges without being set to the power supply voltage and the ground, regulators need be provided exclusively for stabilizing the conversion signals. In a case that the conversion signal is set to the power supply voltage, only a part of the full scale of the A/D converter is used as the input signal range. As a result, the resolution is decreased or the number of conversion cycles is increased to compensate for a decrease of the resolution.

As a method of adjusting the full scale of the A/D conversion for eliminating the above-referred problems it is proposed to set the conversion signal to the power supply voltage and input the conversion signal to only a part of the sampling capacitors so that the conversion signal is decreased equivalently. In this case, however, removal of error from the output of the loop filter by the error canceling operation is incomplete. That is, in the delta-sigma A/D converter of the cascade type, the removal of error from the output of the loop filter remains insufficient.

Further, since the output signal range of an amplifier, which is a structural component of the A/D conversion system, is limited (normally about ½ to ¾ of the power supply voltage), it is necessary to limit the output signal of the amplifier not to exceed the limit in the course of the A/D conversion. To maintain the output signal of the amplifier not to exceed the limit, both of the range of the input signal and the range of the conversion signals may be narrowed. This narrowed ranges result that the full scale of the A/D converter is also narrowed. If the full scale of the A/D conversion system is narrowed, noises become more influential. To counter this problem, a circuit area for a capacitor and an amplifier need be increased and power consumption will be increased.

A range of a signal, which is outputted from the amplifier in the course of the A/D conversion, may be narrowed by increasing a capacitance value of an integrating capacitor of a delta-sigma modulator to be greater than a sum of capacitance values of sampling capacitors. By setting the capacitance value of the sampling capacitor as disclosed in the patent document, a gain of a modulator is set to ½ thereby to narrow the output signal range of the amplifier. However, when the error cancellation is performed, the gain becomes doubled as a reciprocal of ½. Further, since outputs of two first-order delta-sigma modulators are added, the output signal range of the amplifier becomes wider. If an amplifier having a wider output signal range is used to solve the above-referred problems, a circuit area and power consumption need be increased.

SUMMARY

It is therefore an object to provide an A/D conversion system of a delta-sigma type, which performs an A/D conversion with high precision even in a case that the A/D conversion is required to be completed in a short period.

According to one aspect, an A/D conversion system comprises plural loop filters, a quantizer, and an A/D converter. The plural loop filters includes at least a first-stage loop filter to which an input signal is inputted and a last-stage loop filter to which an output signal of a preceding-stage loop filter is inputted as a subject signal to be processed. The quantizer is connected to the last-stage loop filter. The A/D converter is connected to the last-stage loop filter through a converting switch, so that higher bits are formed based on an output of the quantizer and lower bits are formed of an output of the A/D converter.

The last-stage loop filter includes a sampling capacitor, an integrating capacitor, an amplifier circuit, plural path switchover switches and a control circuit. The sampling capacitor samples the subject signal. The integrating capacitor integrates the subject signal sampled by the sampling capacitor. The amplifier circuit amplifies the subject signal with a gain, which is determined by a ratio between a capacitance value of the sampling capacitor and a capacitance value of the integrating capacitor. The plural path switchover switches are arranged to switch over signal paths for a discharging operation, a sampling operation, an integrating operation and an error cancelling operation. The control circuit controls on/off states of the converting switch and the plural path switchover switches.

The control circuit connects, for the discharging operation, both ends of each of the sampling capacitor and the integrating capacitor to an analog ground. The control circuit connects, for the sampling operation, one end of the sampling capacitor to the output of the preceding-stage loop filter and connects the other end of the sampling capacitor to the analog ground thereby to sample the subject signal in the sampling capacitor. The control circuit connects, for the integrating operation, the one end of the sampling capacitor to the analog ground, connects the other end of the sampling capacitor to an input terminal of the amplifier circuit, connects one end of the integrating capacitor to the input terminal of the amplifier circuit and connects the other end of the sampling capacitor to an output terminal of the amplifier circuit thereby to maintain an integration result of the subject signal inputted to the sampling capacitor. The control circuit connects, for the error cancelling operation, the one end of the sampling capacitor to the output terminal of the amplifier circuit, connects the other end of the sampling capacitor to the input terminal of the amplifier circuit, connects the one end of the integrating capacitor to the input terminal of the amplifier circuit and connecting the other end of the integrating capacitor to the analog ground thereby to cancel errors of the capacitance values of the sampling capacitor and the integrating capacitor and output an output signal of the last-stage loop filter from the output terminal of the amplifier circuit. The control circuit turns on the converting switch after controlling the plural path switchover switches to perform the discharging operation, then repeat the sampling operation and the integrating operation and finally perform the error canceling operation.

DETAILED DESCRIPTION OF THE EMBODIMENT

Figure 4:
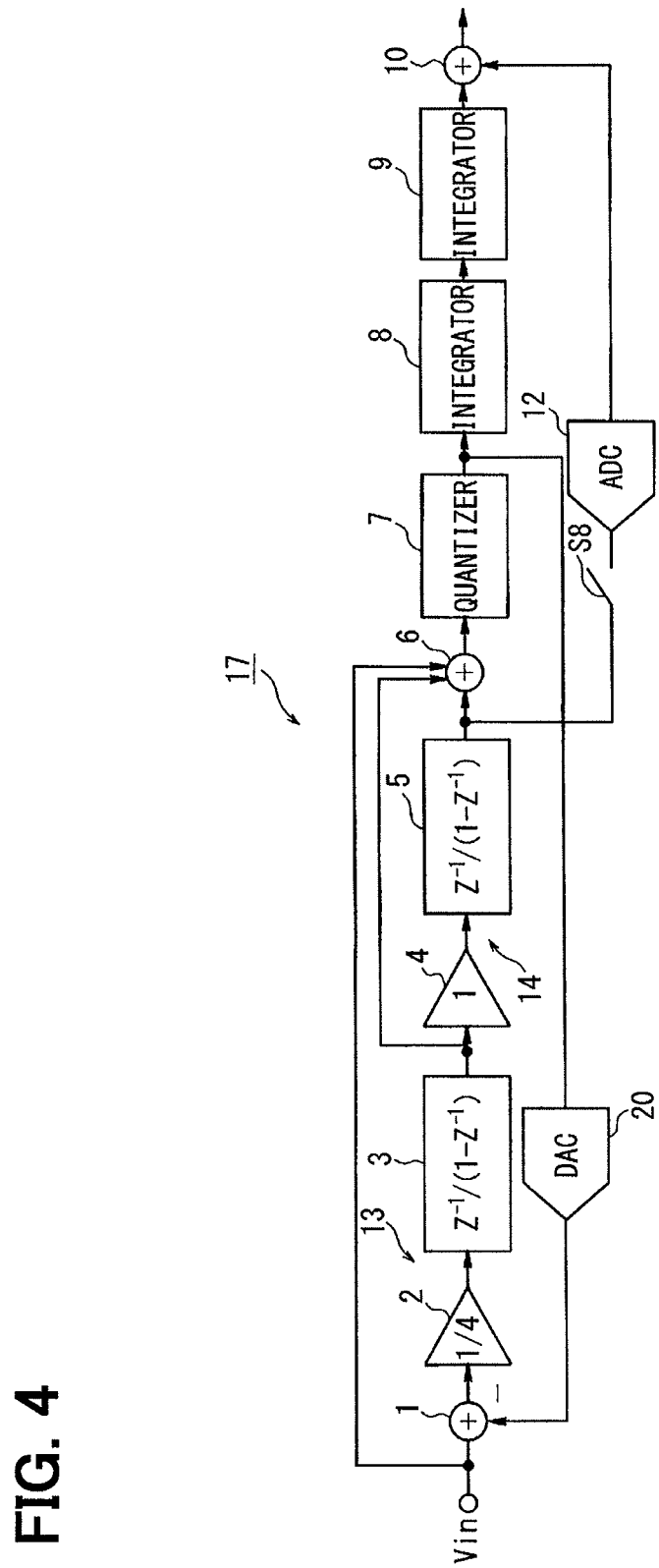
FIG. 4 is a functional block diagram showing the A/D conversion system.

According to one embodiment, a delta-sigma ($\Delta\Sigma$) A/D conversion system 17 of a 2-0 cascade incremental type is formed of plural stages of loop filters, at least two filters, as shown in FIG. 4. An input signal (voltage) Vin is inputted to an adder 1. An output signal of the adder 1 is inputted to a first-stage integrator 3 through an amplifier 2, a gain of which is ¼. An output signal of the integrator 3 is inputted to a last-stage integrator 5 through an amplifier 4, a gain of which is 1. An output signal of the integrator 5 is inputted to a quantizer 7 through an adder 6. The input signal Vin and the output signal of the integrator 3 are also inputted to the adder 6 to be added to the output signal of the integrator 5. The input signals to the adder 6 are weighted respectively, when necessary, and added. An output signal of a D/A converter (DAC) 20 is controlled in accordance with an output of a quantizer 7. The output signal of the D/A converter 20 is inputted to the adder 1 and subtracted from the input signal Vin.

The number of quantization bit of the quantizer 7 is 1 bit for example. It may however be 1.5 bits, 2 bits or more. The output signal of the quantizer 7 is inputted to an adder 10 through two integrators 8 and 9, which are connected in series. Each of the integrators 8, 9 and the adder 10 is configured as a digital circuit. The integrators 8 and 9 are so set that the number of bits of the integrator 9 is larger than that of the integrator 8. The output signal of the integrator 5 is inputted to an A/D converter (ADC) 12 through a converting switch S8. An output of the A/D converter 12 is inputted to the adder 10. In the adder 10, the output of the integrator 9 forms higher bits of an A/D conversion result and an output of the A/D converter 12 forms lower bits. For example, the number of conversion bits of the A/D converter 12 is about 8 to 10.

In the A/D conversion system 17, which is formed of plural loop filters, the amplifier 2 and the integrator 3 form a first-stage loop filter 13 and the amplifier 4 and the integrator 5 form a last-stage loop filter 14. More loop filters may be provided between the loop filters 13 and 14 as intermediate loop filters, the last one of which is a preceding-stage loop filter for the loop filter 14. The loop filter 14 is shown as a functional block by using symbols of the amplifier 4 and the integrator 5 in FIG. 4. However, the loop filter 14 is configured specifically as shown in FIGS. 1A to 1D. In FIGS. 1A to 1D, a part of the configuration (D/A converter 20 and the like) shown in FIG. 4 is not shown.

The last-stage loop filter 14 is formed of a last operational amplifier (last amplification circuit) 15, last capacitors Cs, Cf and last switches S1 to S7. An output terminal of the preceding-stage loop filter, that is, the first integrator 3 of the first-stage loop filter 13 in this example, is connected to an inverting input terminal (−) of the operational amplifier 15 through the switch S1 and the capacitor Cs. This inverting input terminal is connected to the analog ground through the capacitor Cf and the switch S6. A non-inverting input terminal (+) of the operational amplifier 15 is connected to the analog ground.

Both ends of the capacitor Cs are connected to the analog ground through the switches S2 and S4, respectively. A common connection point of the switches S1 and S2 is connected to the output terminal of the operational amplifier 15 (input side of the adder 6) through the switch S7. A common connection point of the capacitor Cf and the switch S6 is connected to the output terminal of the operational amplifier 15 through the switch S5. That is, the integrator 5 is configured with a switched-capacitor circuit. Each of the switches S1 to S7 (path switchover switches) and the switch S8 (converting switch) is controlled to turn on and off by a control circuit 20.

Figure 2:
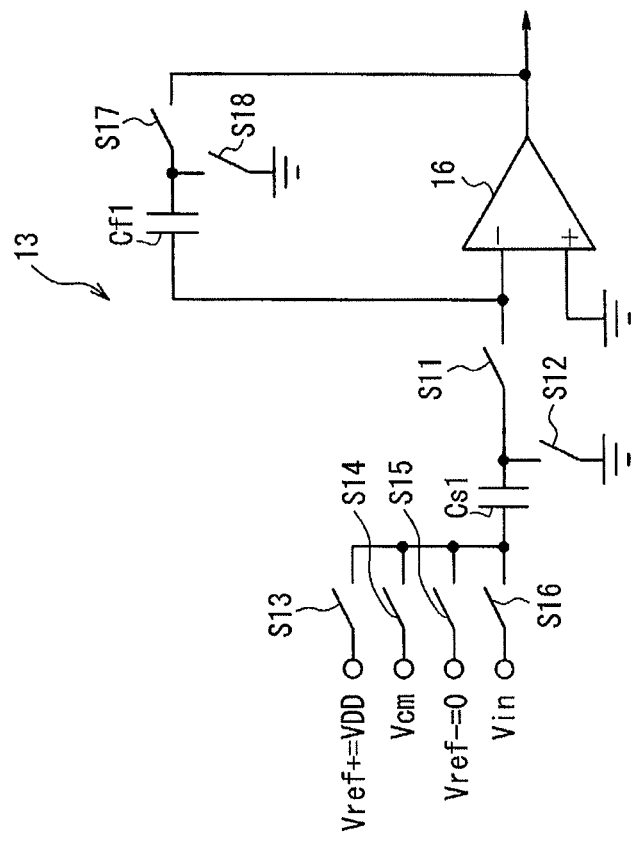
FIG. 2 is a circuit diagram showing a first-stage loop filter of the A/D conversion system shown in FIGS. 1A to 1D.

As shown in FIG. 2, the first-stage loop filter 13 is formed of a first operational amplifier (first amplifier circuit) 16, a first sampling capacitor Cs1 for a first sampling operation, a first integrating capacitor Cf1 for a first integrating operation and first plural switchover switches S11 to S18. A non-inverting input terminal (+) of the operational amplifier 16 is connected to the analog ground. An inverting input terminal (−) of the operational amplifier 16 is connected to one end of the capacitor Cs1 through the switch S11. The one end of the capacitor Cs1 is connected to the analog ground through the switch S12.

Plural conversion voltage signals Vref+ (power supply voltage VDD), Vcm (VDD/2, same potential as the analog ground), Vref− (0V) and the input signal Vin are applied to the other end of the capacitor Cs1. The conversion voltage signals Vref+, Vcm and Vref− are used as reference voltage signals.

The inverting input terminal of the operational amplifier 16 is connected to one end of the capacitor Cf1. An output terminal of the operational amplifier 16 is connected to the other end of the capacitor Cf1 through the switch 17. The other end of the capacitor Cf1 is connected to the analog ground through the switch S18. Switches other than the switches S13 to S15 are path switchover switches.

In the loop filter 13, similarly to the loop filter 14, a first sampling operation is performed after discharging each capacitor by connecting its both S12 and S16 are turned on to sample the input signal Vin to the capacitor Cs1, Then the switch S16 is turned on and the switches S12 and S16 are turned off to start a first integrating operation, Either one of the conversion signals Vref+, Vref− and Vcm is supplied to an input-side terminal of the capacitor Cs1 in accordance with the output of the quantizer 7. Thus the integrating operation and the D/A converting operation are performed concurrently, that is, in parallel. This D/A converting operation corresponds to the D/A converter 20 shown in FIG. 4, In the loop filter 13 shown in FIG. 2, the D/A converter 20 and the adder 1 shown in FIG. 4 are included in one switched capacitor circuit, Each of the switches S11 to S18 is also controlled to turn on and off by the control circuit 20.

The delta-sigma type A/D conversion system 17 configured as described above operates as follows.

The last-stage loop filter 14 has four operation phases, that is, a last resetting operation (last discharging operation), a last sampling operation, a last integrating operation and an error cancelling operation.

<Resetting Operation>

Figure 1A:
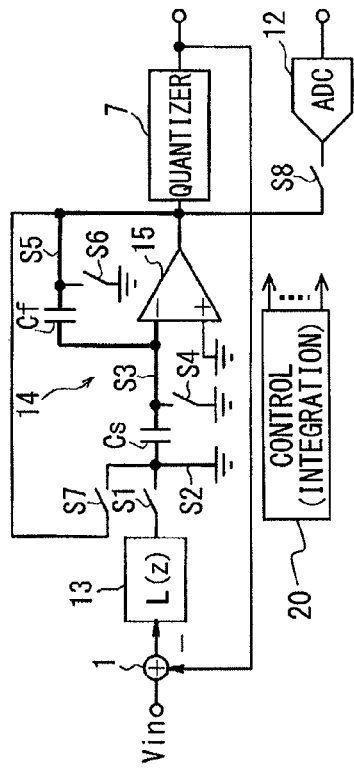
FIGS. 1A to 1D are circuit diagrams showing on/off states of each switchover switch in correspondence to each operation phase of a last-stage loop filter of an A/D conversion system in one embodiment.

As shown in FIG. 1A, the switches S2 to S4 and S6 are turned on to discharge stored charges of the capacitors Cs and Cf. In this resetting operation, the integrators 8, 9 and the loop filter 13 are also reset at the same time.

<Sampling Operation>

Figure 1B:
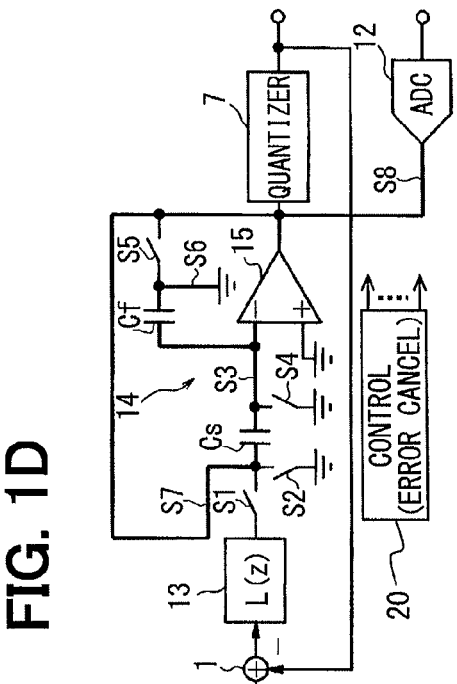

As shown in FIG. 1B, the switches S1 to S4 and S5 are turned on to charge the sampling capacitor Cs with an output signal (subject signal to be processed) of the loop filter 13 thereby to sample the output signal in the capacitor Cs. At this time, the integrating capacitor Cf is connected between the inverting input terminal and the output terminal of the operational amplifier 15. The charge in the preceding operation phase (resetting operation or integrating operation) is thus maintained.

<Integrating Operation>

Figure 1C:
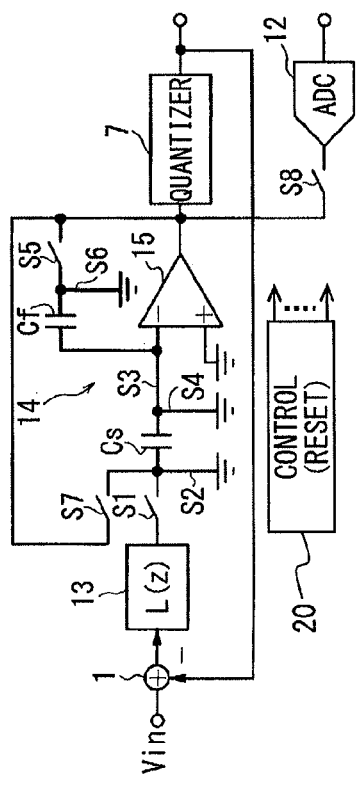

As shown in FIG. 1C, the switches S2, S3 and S5 are turned on to transfer the charge sampled to the capacitor Cs in the sampling operation to the integration capacitor Cf thereby to integrate the output signal of the loop filter 13. The output signal of the loop filter 13 is integrated with a gain (Cs/Cf folds). The gain 1 of the amplifier 4 shown in the block diagram of FIG. 4 is the gain of the loop filter 14. Here, the capacitance values of the capacitors Cs and Cf are set equally.

The capacitance values of the capacitors Cs and Cf may be different. However, with equal capacitance values, the gain of the loop filter 14 in the integrating operation and the gain of the loop filter 14 in the error cancelling operation become generally equal. As a result, performance requirements such as bandwidths and output signal ranges required for the operational amplifier 15 for the integrating operation and the error cancelling operation become generally equal and power consumption of the operational amplifier can be reduced.

Figure 3:
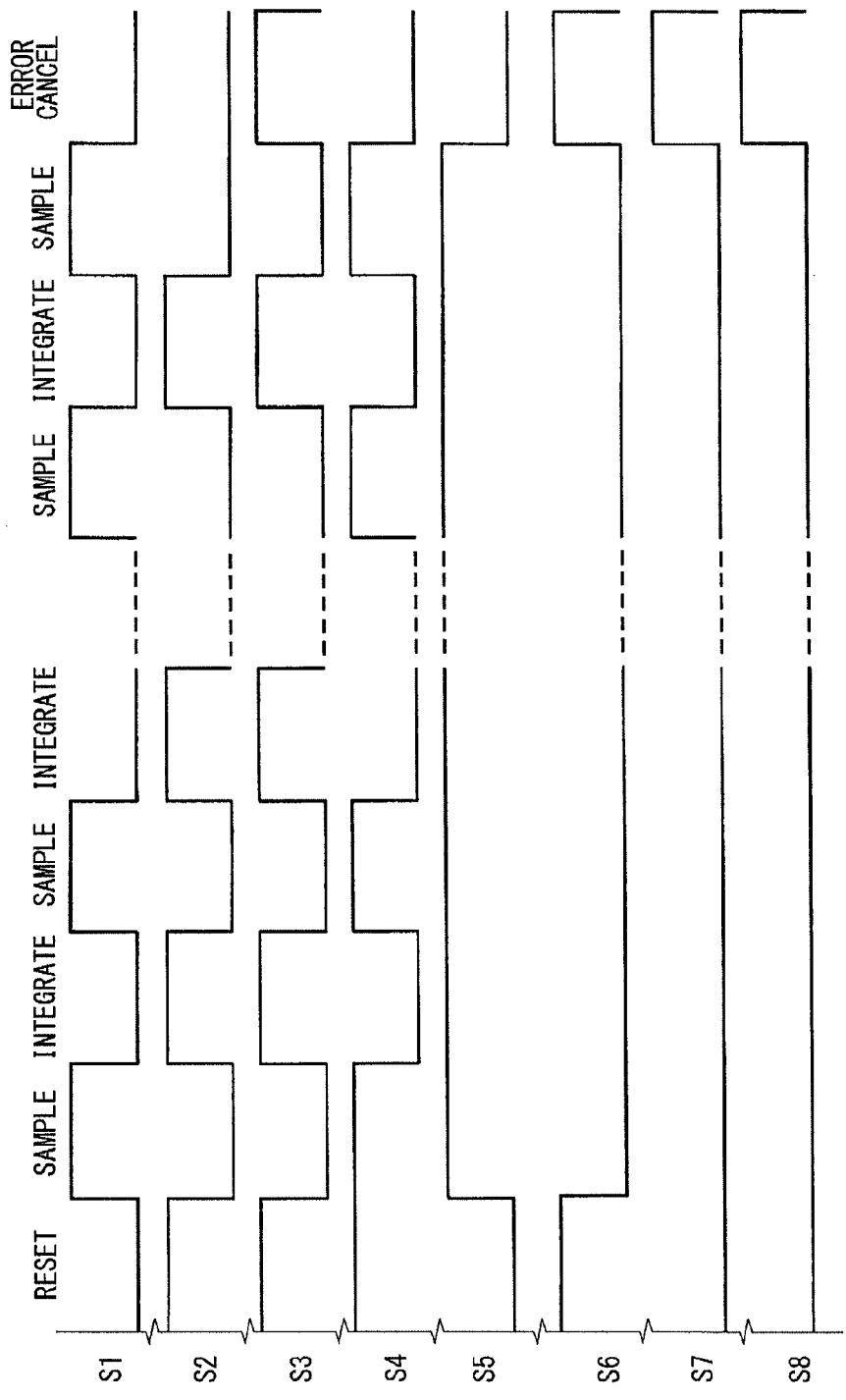
FIG. 3 is a time chart showing on/off states switchover switches of the last-stage loop filter shown in FIG. 1.

As shown in FIG. 3, the control circuit 20 repeats the sampling operation and the integrating operation of the loop filter 14 alternately plural times. In the end of the A/D conversion period, the sampling operation is followed by the error cancelling operation at the end.

<Error Cancelling Operation>

Figure 1D:
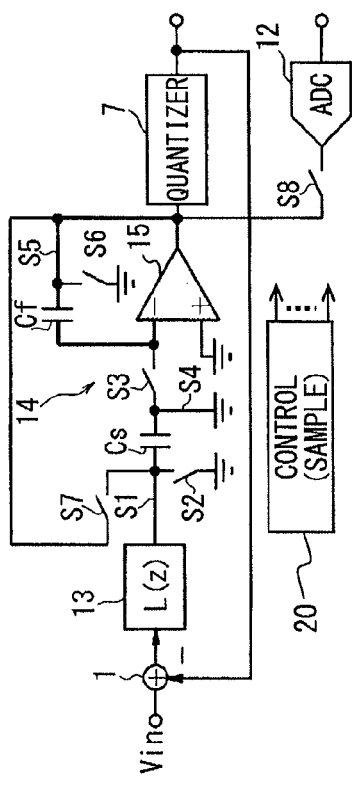

As shown in FIG. 1D, the switches S3 and S6 to S8 are turned on to input the output signal of the loop filter 14 to the A/D converter 12. At this time, a gain of the loop filter 14 is Cf/Cs, which is a reciprocal of the gain of the integrating operation. Thus, even when the gain (Cs/Cf) of the loop filter 14 in the sampling operation and the integrating operation has an error due to variation in the capacitance values, the error can be cancelled out. One cycle of the A/D conversion period is finished as described above.

The level of error, which is cancelled by the error cancelling operation, generally depends on an average value of the signal outputted from the loop filter 13 and the number of repetitions of the sampling operation and the integrating operation performed alternately. As far as the average value remains the same, a maximum value of accumulated errors cancelled by the error cancelling operation increases and the number of repetitions increases. The number of repetitions of alternate sampling operation and the integrating operation is for example 10 times or more. However it may be set based on the accuracy of conversion required for the A/D converter, the assumed level of error of gain of loop filters such as the first-stage loop filter 13, which precede the last-stage loop filter 14, the number of bits of the A/D converter 12 and the like.

The advantage of the error cancellation by the error cancelling operation will be described here by using mathematical equations. Assuming that the signal outputted at the time of completion of the integrating operations of "n" cycles after the resetting operation of the loop filter 13 is $V_{LFout}(n)$, the output signal Vout of the loop filter 14 at the time of completion of "m" cycles of integrating operations of the loop filter 13 by the loop filter 14 is expressed as follows.

[Equation 1]

$$V_{out} = \frac{C_s}{C_f} \sum_{n=1}^{m} V_{LFout}(n) \quad (1)$$

Assuming that the capacitance values of the capacitors Cs and Cf have errors α and β, respectively, the output signal Vout' of the loop filter 14, which is affected by such errors, is expressed as follows.

[Equation 2]

$$V'_{out} = \left(\frac{C_s + \alpha}{C_f + \beta}\right) \sum_{n=1}^{m} V_{LFout}(n) \quad (2)$$

Thus the influence of the errors of the capacitance values results in errors of the gains of the loop filter 14.

The output signal Vout'' of the loop filter 14 after completion of the error cancelling operation is expressed as follows.

[Equation 3]

$$V''_{out} = \left(\frac{C_f + \beta}{C_s + \alpha}\right)\left(\frac{C_s + \alpha}{C_f + \beta}\right) \sum_{n=1}^{m} V_{LFout}(n) = \sum_{n=1}^{m} V_{LFout}(n) \quad (3)$$

The gain related to the integration value of the output signal $V_{LFout}(n)$ of the loop filter 13 is 1 irrespective of the capacitance values Cs and Cf. Thus the influence of the error of the capacitance values is cancelled out.

According to the present embodiment, as described above, the input signal Vin is quantized by the quantizer 7 after being passed through the loop filters 13 and 14, The loop filter 14 is provided with the sampling capacitor Cs for sampling the output signal of the loop filter 13, the integrating capacitor Cf for integrating the signal sampled by the capacitor Cs and the path switchover switches S1 to S7.

The control circuit 20 controls the on/off states of the switches S1 to S7 so that the capacitors Cs and Cf discharge and the loop filter 14 repeats the sampling operation and the integrating operation plural times. The capacitors Cs and Cf are connected to the operational amplifier 15 in a state reverse to the state of the integrating operation time so that the error cancelling operation is performed lastly. The converting switch S8 is turned on so that the A/D converter 12 A/D-converts the output signal of the loop filter 14.

If the capacitors Cs and Cf have errors in the capacitance values, such errors result in errors in the gain and output signal of the loop filter 14. Therefore, the signal of the loop filter 14, in which the capacitors Cs and Cf are connected in the state in reverse to the state of the integrating operation time, is A/D converted by the A/D converter 12 so that the lower bits of the A/D conversion result is generated. The generated lower bits are added to the higher bits generated by the delta-sigma conversion to output the A/D conversion result, which is free from the adversary effect of the errors of the capacitance values. The A/D converter 12 is formed of a Nyquist A/D converter, which outputs one A/D conversion result in response to one sampling of an input. Errors of structural elements forming the A/D converter affect generally more adversely on the A/D conversion result in comparison to the delta-sigma A/D converter, which performs oversampling. However the A/D converter 12 can generally have sufficiently high conversion accuracy if the A/D converter 12 has about 8 to 10 bits. As far as the accuracy of the A/D converter 12 is sufficient, speed of conversion or resolution of conversion can be improved without affecting the conversion accuracy of the A/D conversion system 17.

The control circuit 20 is configured to start the error cancelling operation without performing the integrating operation following the last one of the repeated sampling operations. That is, the loop filter 14 does not perform the D/A converting operation (integrating operation) at the time of quantization as opposed to the device of patent document or the loop filter 13, which uses the conversion signals. As a result, the gain error of the loop filter 14 can be cancelled out by starting the error cancelling operation directly from the state of sampling (sampling operation) of the output signal of the loop filter 13. The lower bits can be generated by A/D converting the output signal of the loop filter 14 by the A/D converter 12. Accordingly the on/off control of the control circuit 20 for the switches is more simplified. Since the number of cycles required for the A/D conversion is reduced, the conversion speed can be increased. Further, the influence of error, which arises from the limited gain of the operational amplifier 15, or noise can be reduced.

That is, the A/D conversion system 17 according to the present embodiment is the incremental type, which performs the resetting operation each time one A/D conversion result is produced. The A/D conversion system 17 is also the delta-sigma A/D converter of the cascade (hybrid) configuration. The A/D conversion system 17 is thus characterized in that the output of the filter 14 is inputted to the A/D converter 12 only once at the last stage of the A/D conversion period. As a result, the error cancelling operation need be performed only once at the time of inputting the output of the loop filter 14 to the A/D converter 12. In addition, according to the incremental type, the integration result of the input signal of the loop filter 14 need not be maintained at the time of completion of the A/D conversion. According to the configuration, which does not require the D/A converting operation by the loop filter 14 as in the present embodiment, the error cancelling operation is started immediately after the last one of the sampling operations without integrating operation. Thus the error can be cancelled efficiently without increasing the number of special cycles.

Even in a case of the delta-sigma A/D conversion system of a general cascade type, which is not the incremental type and inputs a signal continuously for a long period, the loop filter may be configured in the similar manner as the incremental type. For this reason, the error can be cancelled by using the similar configuration as the loop filter 14. However the error cancelling operation need be performed continuously during the A/D conversion period. Further, the integrating operation for maintaining the integration result of the loop filter is needed at every error cancelling operation after the error cancelling operation is started following the sampling operation at the time of performing the error cancelling operation. Thus the number of cycles increases largely.

Further, the configuration shown in FIG. 4 is the 2-0 cascade incremental type (the order of a delta-sigma modulation side is 2). As a result, in comparison to a configuration, which uses a first-order delta-sigma modulation, it has the feature of a higher-order delta-sigma modulation, that is, it is less influenced by the error arising from the limited gain of the operational amplifier 15 and it provides high resolution with less number of cycles, Additionally, since it also realizes cancellation of errors of the loop filter 14, the number of conversion bits can be easily increased.

Further, the A/D conversion system 17 is so configured that the loop filter 13 includes the sampling capacitor Cs1 and the integrating capacitor Cf1 and performs the discharging (resetting) operation, the sampling operation and the integrating operation by switching over the signal paths of these capacitors. The A/D conversion system 17 is so configured that the signal Vref+ or Vref−, which corresponds to the power supply voltage or the ground signal are connectable to the input-side terminal of the capacitor Cs1 and the control circuit 20 controls each switch to sequentially perform the sampling operation and the integrating operation after the discharging operation. It is thus possible with this configuration to perform the A/D conversion without using the conversion signal of the level different from the power supply voltage in the loop filter 13 as in the loop filter 14, which uses no conversion signal. As a result, it is not required to provide a specific regulator and connect an external capacitor to an output terminal of the regulator. The A/D conversion system 17 can be sized small.

According to the present embodiment, it is not necessary in the loop filter 13 to input the conversion signals to all of the sampling capacitors at the time of integrating operation as opposed to the patent document. For this reason, by adding the sampling capacitor, to which no conversion signal is inputted at the time of integrating operation, the input signal is amplified equivalently or the conversion signal is reduced equivalently. As a result, even when the range of the input signal Vin is narrow, the A/D conversion can be performed without narrowing the range of the conversion signal or degrading the resolution.

Even if the configuration of inputting the conversion signal to all of the sampling capacitors at the time of integrating operation as in the patent document, the delta-sigma modulator of second-order is formed of the loop filters 13 and 14. Therefore, the range of the input signal Vin is limited naturally to, for example, about ½ to ¾ of the power supply voltage for maintaining stability of the entirety of the loop filters. Even if the range of the input signal of the A/D conversion system 17 is limited to about ½ to ¾ of the power supply voltage, for example, by the amplifier circuit of the preceding stage, the range of the input signal becomes equivalent to the input signal range of the A/D conversion system 17, which can be originally usable. Therefore, the resolution, which the A/D conversion system 17 can originally attain, is restricted from lowering much. Further even if the range of the input signal yin is narrower than the input range of the A/D conversion system, which can originally be usable, the increase of the number of cycles required to compensate the resolution can be maintained small in comparison to the first-order delta-sigma modulator.

The A/D conversion system is not limited to only the embodiment described above and shown in the drawings but may be modified or varied as follows.

The gain of the amplifiers 2 and 4 may be altered arbitrarily in accordance with the output range of the operational amplifier used in the loop filter or the configuration of the loop filter. The number of bits of the integrators 8, 9 and the A/D converter 12 may be altered arbitrarily in accordance with individual design. The integrators 8 and 9 may be replaced with decimation filters.

Transmission forms of the signals of the loop filters 13 and 14 may be a single end or a completely differential.

The loop filter may be configured in a cascade type (hybrid type) of 2-0 or higher order. If the order of the loop filter is 2 or higher, like the loop filter 13 shown in FIG. 2, it is only necessary that the loop filter, which performs the integrating operation and the D/A converting operation in parallel, is in one loop filter including at least the first stage. The number of quantized bits of the quantizer may be a multiple bits (including 1.5 bits).

What is claimed is:

1. An A/D conversion system comprising:
   plural loop filters including at least a first-stage loop filter to which an input signal is inputted and a last-stage loop filter to which an output signal of a preceding-stage loop filter is inputted as a subject signal to be processed;
   a quantizer connected to the last-stage loop filter; and
   an A/D converter connected to the last-stage loop filter through a last converting switch, so that higher bits are formed based on an output of the quantizer and lower bits are formed of an output of the A/D converter,
   wherein the last-stage loop filter includes:
      a last sampling capacitor for sampling the subject signal;
      a last integrating capacitor for integrating the subject signal sampled by the last sampling capacitor;
      a last amplifier circuit for amplifying the subject signal with a gain, which is determined by a ratio between a capacitance value of the last sampling capacitor and a capacitance value of the last integrating capacitor;
      last plural path switchover switches arranged to switch over signal paths for a last discharging operation, a last sampling operation, a last integrating operation and an error cancelling operation; and
      a control circuit for controlling on/off states of the last converting switch and the last plural path switchover switches,
      the control circuit connecting, for the last discharging operation, both ends of each of the last sampling capacitor and the last integrating capacitor to an analog ground,
      the control circuit connecting, for the last sampling operation, one end of the last sampling capacitor to the output of the preceding-stage loop filter and connecting an other end of the last sampling capacitor to the analog ground thereby to sample the subject signal in the last sampling capacitor,
      the control circuit connecting, for the last integrating operation, the one end of the last sampling capacitor to the analog ground, connecting the other end of the last sampling capacitor to an input terminal of the last amplifier circuit, connecting one end of the last integrating capacitor to the input terminal of the last amplifier circuit and connecting an other end of the last sampling capacitor to an output terminal of the last amplifier circuit thereby to maintain an integration result of the subject signal inputted to the last sampling capacitor,
      the control circuit connecting, for the error cancelling operation, the one end of the last sampling capacitor to the output terminal of the last amplifier circuit, connecting the other end of the last sampling capacitor to the input terminal of the last amplifier circuit, connecting the one end of the last integrating capacitor to the input terminal of the last amplifier circuit and connecting the other end of the last integrating capacitor to the analog ground thereby to cancel errors of the capacitance values of the last sampling capacitor and the last integrating capacitor and output an output signal of the last-stage loop filter from the output terminal of the last amplifier circuit, and
      the control circuit turning on the last converting switch after controlling the last plural path switchover switches to perform the last discharging operation, then repeat the last sampling operation and the last integrating operation and finally perform the error canceling operation.

2. The A/D conversion system according to claim 1, wherein:
the control circuit starts the error cancelling operation following a last sampling operation without a last integrating operation in a repetition of the last sampling operation and the last integrating operation.

3. The A/D conversion system according to claim 1, wherein the first-stage loop filter includes:
a first sampling capacitor for sampling the input signal;
a first integrating capacitor for integrating the input signal sampled by the first sampling capacitor;
a first amplifier circuit for amplifying an input signal by a gain, which is determined by a ratio between a capacitance value of the first sampling capacitor and a capacitance value of the first integrating capacitor;
first plural path switchover switches arranged to switch over signal paths for first discharging operations of the first sampling capacitor and the first integrating capacitor, a first sampling operation of the first sampling capacitor, and a D/A converting operation together with the first integrating operation; and
first plural converting switches arranged to connect a conversion signal, which corresponds to a power supply voltage signal, to at least one of input side terminals of the first sampling capacitor,
the first discharging operations being performed by connecting both ends of each of the first sampling capacitor and the first integrating capacitor to the analog ground,
the first sampling operation being performed by applying the input signal to one end of the sampling capacitor and connecting an other end of the sampling capacitor to the analog ground thereby to sample the input signal in the sampling capacitor,
the D/A converting operation being performed by connecting at least the one end of the first sampling capacitor to a D/A conversion signal, connecting the other end of the first sampling capacitor to the first amplifier circuit, connecting one end of the first sampling capacitor, which is not connected to the D/A conversion signal, to the analog ground, connecting the other end of the first sampling capacitor to an input terminal of the first amplifier circuit, connecting one end of the first integrating capacitor to the input terminal for the first amplifier circuit, and connecting the other end of the first sampling capacitor to an output terminal of the first integrating capacitor thereby to integrate a signal inputted to the first sampling capacitor,
the control circuit controlling the first plural path switchover switches and the first converting switches to perform the first sampling operation and the D/A conversion operation together with the first integrating operation after performing the first discharging operations.

* * * * *